(12) United States Patent
Chou

(10) Patent No.: US 7,903,416 B2
(45) Date of Patent: Mar. 8, 2011

(54) FLAT PANEL DISPLAY

(75) Inventor: Bor-Bin Chou, Miao-Li County (TW)

(73) Assignee: Coretronic Display Solution Corporation, Miao-Li Country (TW)

( * ) Notice: Subject to any disclaimer, the term of this patent is extended or adjusted under 35 U.S.C. 154(b) by 37 days.

(21) Appl. No.: 12/570,269

(22) Filed: Sep. 30, 2009

(65) Prior Publication Data
US 2010/0172100 A1 Jul. 8, 2010

(30) Foreign Application Priority Data
Jan. 5, 2009 (TW) .............................. 98200020 U

(51) Int. Cl.
H05K 7/20 (2006.01)
(52) U.S. Cl. .................... 361/710; 361/697.54; 361/688; 361/689; 361/704; 361/707; 361/714; 313/46; 313/582; 349/58; 349/161
(58) Field of Classification Search ............ 361/679.21, 361/679.34, 679.46, 679.54, 688–692, 704–712, 361/714, 724, 728, 736, 748, 752, 831; 313/11, 313/13, 46, 582–587, 573, 45, 48, 24, 44, 313/27, 494, 634; 349/58, 73, 121, 161, 349/61–65, 20, 32, 56, 59; 165/80.3, 104.33, 165/122, 126, 185; 174/15.1, 16.1, 16.3, 174/252, 260
See application file for complete search history.

(56) References Cited

U.S. PATENT DOCUMENTS

| | | | | |
|---|---|---|---|---|
| 5,299,038 | A * | 3/1994 | Hamada et al. | 349/161 |
| 5,583,681 | A * | 12/1996 | Shioya et al. | 349/60 |
| 6,522,543 | B2 * | 2/2003 | Kurihara et al. | 361/704 |
| 6,833,674 | B2 * | 12/2004 | Kaneko et al. | 313/587 |
| 7,064,952 | B1 * | 6/2006 | Chen et al. | 361/679.01 |
| 7,164,586 | B2 * | 1/2007 | Lin | 361/714 |
| 7,215,549 | B2 * | 5/2007 | Kim | 361/704 |
| 7,218,521 | B2 * | 5/2007 | Kim | 361/704 |
| 7,224,121 | B2 * | 5/2007 | Ahn | 313/582 |
| 7,287,895 | B2 * | 10/2007 | Lin et al. | 362/633 |

(Continued)

FOREIGN PATENT DOCUMENTS
TW M309684 4/2004
(Continued)

OTHER PUBLICATIONS

English abstract of TW I273318, pub. Feb. 11, 2007.
(Continued)

Primary Examiner — Michael V Datskovskiy
(74) Attorney, Agent, or Firm — Thomas|Kayden

(57) ABSTRACT

A flat panel display including a base frame, a display panel module, and a heat-conductive structure is provided. The base frame includes a control unit. The display panel module is disposed in the base frame and includes a back bracket, a first heating element, and a second heating element. The first heating element and the second heating element are disposed in the back bracket and electrically connected to the control unit. A first distance is formed between the back bracket and the base frame to define a first air passage, a second distance is formed between the back bracket and the base frame to define a second air passage, and the first distance is shorter than the second distance. The heat-conductive structure is disposed in the first air passage, and the position of the heat-conductive structure is corresponding to the position of the first heating element.

20 Claims, 1 Drawing Sheet

U.S. PATENT DOCUMENTS

| | | | | |
|---|---|---|---|---|
| 7,336,494 B2 * | 2/2008 | Nishimura et al. | ............ | 361/714 |
| 7,342,792 B2 * | 3/2008 | Kim et al. | ...................... | 361/704 |
| 7,369,400 B2 * | 5/2008 | Bang et al. | ............... | 361/679.27 |
| 7,372,700 B2 * | 5/2008 | Jeong | ............................ | 361/704 |
| 7,379,302 B2 * | 5/2008 | Cai et al. | ....................... | 361/710 |
| 7,388,748 B2 * | 6/2008 | Shin | ............................... | 361/704 |
| 7,411,648 B2 * | 8/2008 | Ishida | ........................... | 349/161 |
| 7,417,859 B2 * | 8/2008 | Bae et al. | ....................... | 361/710 |
| 7,436,668 B2 * | 10/2008 | Bae | ............................... | 361/704 |
| 7,447,034 B2 * | 11/2008 | Shin | ............................... | 361/714 |
| 7,518,670 B2 * | 4/2009 | Song et al. | ...................... | 349/58 |
| 7,530,703 B2 * | 5/2009 | Ryu | ............................... | 362/29 |
| 7,542,286 B2 * | 6/2009 | Kang | ............................ | 361/690 |
| 7,602,109 B2 * | 10/2009 | Ma | ................................. | 313/46 |
| 7,667,964 B2 * | 2/2010 | Kang et al. | ..................... | 361/692 |
| 7,808,572 B2 * | 10/2010 | Lee et al. | ........................ | 349/58 |
| 2006/0203445 A1 * | 9/2006 | Hsu et al. | ........................ | 361/687 |
| 2007/0211191 A1 * | 9/2007 | Cho et al. | ......................... | 349/58 |

FOREIGN PATENT DOCUMENTS

| | | |
|---|---|---|
| TW | M244475 | 9/2004 |
| TW | I273318 | 2/2007 |
| TW | I276391 | 3/2007 |
| TW | I286721 | 9/2007 |
| TW | I286912 | 9/2007 |

OTHER PUBLICATIONS

English abstract of TW M309684, pub. Apr. 11, 2007.
English abstract of TW I286721, pub. Sep. 11, 2007.
English abstract of TW I286912, pub. Sep. 11, 2007.
English abstract of TW I276391, pub. Mar. 11, 2007.
English abstract of TW M244475, pub. Sep. 21, 2004.

* cited by examiner

FLAT PANEL DISPLAY

This Application claims priority of Taiwan Patent Application No. 098200020, filed on Jan. 5, 2009, the entirety of which is incorporated by reference herein.

BACKGROUND OF THE INVENTION

1. Field of the Invention

The invention provides a flat panel display, and in particular, provides a flat panel display with improved heat-dissipating efficiency.

2. Description of the Related Art

Flat panel displays continue to develop toward slim type and miniaturized flat panel displays, such that no additional space is provided within the compactable interior of the flat panel display. As a result, fans for dissipating heat are not adapted to flat panel displays. Thus, heat dissipation within the compactable interior of the flat panel display is accomplished by natural convection.

A housing of a conventional flat panel display is provided with a display panel module and a base frame. The display panel module includes main heating elements, such as control circuits and light sources. Usually, a gap is kept between the display panel module and the base frame to allow cold air to pass through, assisting with heat-dissipation of the display panel module. However, due to very slim type designs of flat panel displays, the interior structure thereof is rearranged versus conventional designs. Thus, increasing difficulty for achieving heat-dissipation, wherein cold air is not easily allowed to pass through the upper periphery of the flat panel display by the gap. As such, often, because of the relatively low thermal conductivity of air, heat accumulated at the upper periphery of very slim type designed flat panel displays is not efficiently dissipated.

SUMMARY

The invention provides a plat panel display including improved heat-dissipating efficiency.

Other objectives and advantages will be understood from the disclosure of the present invention.

Accordingly, an embodiment of the invention provides a flat panel display. The flat panel display includes a base frame, a display panel module, and a heat-conductive structure. The base frame includes a control unit. The display panel module disposed in the base frame includes a back bracket, a first heating element, and a second heating element. The first heating element and the second heating element are disposed in the back bracket and electrically connected to the control unit. The heat-conductive structure is disposed between the back bracket and the base frame, and the position of the heat-conductive structure is corresponding to the position of the first heating element.

Another embodiment of the invention provides another flat panel display. The flat panel display includes a base frame, a display panel module, and a heat-conductive structure. The base frame includes a control unit. The display panel module disposed in the base frame includes a back bracket, a first heating element, and a second heating element. The first heating element and the second heating element are disposed in the back bracket and electrically connected to the control unit. A first distance is formed between the back bracket and the base frame to define a first air passage, a second distance is formed between the back bracket and the base frame to define a second air passage, and the first distance is shorter than the second distance. The heat-conductive structure is disposed in the first air passage, and the position of heat-conductive structure is corresponding to the position of the first heating element.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The invention may be more fully understood by reading the subsequent detailed description and examples with references made to the accompanying drawings, wherein.

DESCRIPTION OF THE PREFERRED EMBODIMENTS

Figure 1:
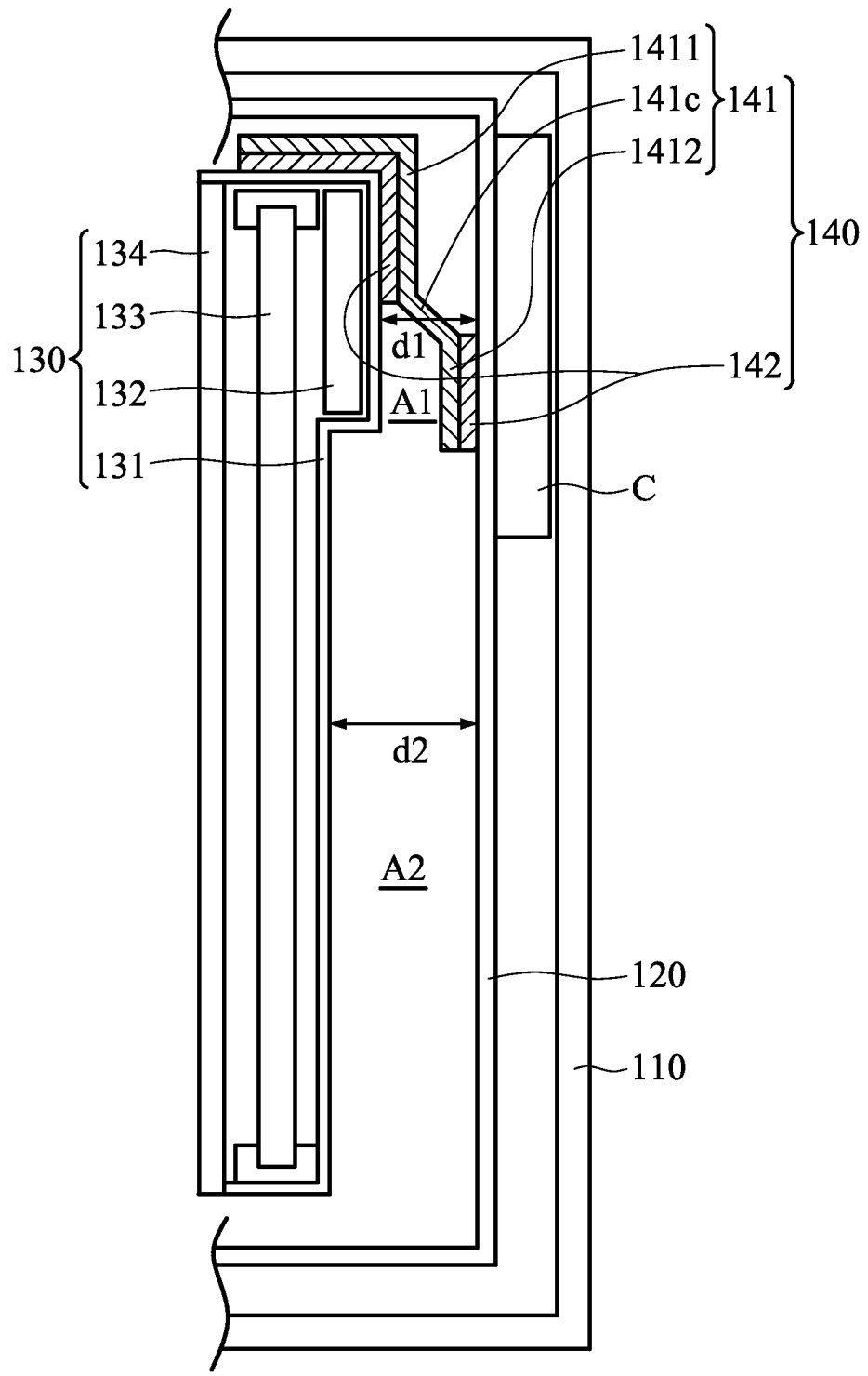
FIG. 1 is a schematic view showing a section of a flat panel display according to an embodiment of the invention.

In the following detailed description of the preferred embodiments of the invention, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

FIG. 1 depicts a schematic view showing a section of a flat panel display according to an embodiment of the invention. As shown in FIG. 1, the flat panel display 100 of the embodiment of the invention includes a housing 110, a base frame 120, a display panel module 130, and a heat-conductive structure 140.

The base frame 120, made of metal, is disposed in the housing 110, and the base frame 120 is provided with a control unit C. The control unit C includes a power supply module, a firmware control circuit panel, and an inverter. Additionally, a plurality of openings (not shown) are disposed on a side of the base frame 120, allowing heat accumulated within the flat panel display 100 to dissipate via air convection.

The display panel module 130 is disposed in the base frame 120, and the display panel module 130 is fastened in the housing 110 by the base frame 120. The display panel module 130 includes a back bracket 131, a first heating element 132, a second heating element 133, and a liquid crystal display panel 134. It should be noted that the display panel module 130 may include other components and is not limited.

The first heating element 132 is a timing control panel, and the second heating element 133 includes a plurality of light emitting devices, for example, a lamp. The first heating element 132, the second heating element 133, and the liquid crystal display panel 134 are disposed in the back bracket 131 respectively. The first heating element 132 electrically connects to the liquid crystal display panel 134 and the firmware control circuit board of the control unit C. The firmware controls timing for operation of the source driver and the gate driver of the liquid crystal display panel 134. The second heating element 133 electrically connects to the inverter of the control unit C to light up the light emitting device.

When the display panel module 130 is disposed in the base frame 120, a first distance d1 and a second distance d2 are respectively formed between the base frame 120 and the back bracket 131 of the display panel module 130. The first distance d1 defines a first air passage A1 between the base frame 120 and the back bracket 131, and the second distance d2 defines a second air passage A2 between the base frame 120 and the back bracket 131. The first air passage A1 is narrower than the second air passage A2 because the first distance d1 is shorter than the second distance d2.

The heat-conductive structure 140 is disposed between the base frame 120 and the back bracket 131 of the display panel module 130. In detail, the heat-conductive structure 140 is disposed in the first air passage A1, and the position of the heat-conductive structure 140 corresponds to the position of the first heating element 132. The heat-conductive structure 140 includes a heat-conductive member 141 and two heat-conductive interfaces 142. The heat-conductive member 141 is made of high thermal conductivity material, such as graphite or metal, and includes a first portion 1411, a second portion 1412, and a connecting portion 141c. The first portion 1411 abuts the back bracket 131, the second portion 1412 abuts the base frame 120, and the connecting portion 141c connects the first portion 1411 and the second portion 1412, wherein the first portion 1411, the second portion 1412, and the connecting portion 141c are integrally formed as a single piece. The two heat-conductive interfaces 142 are thermal pastes or thermal pads and disposed between the back bracket 131 and the first portion 1411, and between the base frame 120 and the second portion 1412, respectively. The two heat-conductive interfaces 142 may decrease thermal contact resistances between the heat-conductive member 141 and the base frame 120 and between the heat-conductive member 141 and the back bracket 131 of the display panel module 130.

In the embodiment of the invention, the plurality of openings on the side of the base frame 120 allow air convection in order to dissipate heat. Additionally, the heat-conductive structure 140 disposed between the base frame 120 and the back bracket 131 of the display module 130 further helps to dissipate heat by the heat-conductive structure 140 with high thermal conductivity being disposed in direct contact to the base frame 120 and the back bracket 131. Specifically, in the first air passage A1 where air briefly passes through, the disposition of the heat-conductive structure 140 is able to dissipate heat accumulated in the upper periphery of the flat panel display 100. Meanwhile, according to the statistical measurements of the embodiment of the invention, the temperature measured at the upper periphery of the flat panel display 100 of the embodiment is 10° C. lower than conventional flat panel displays, thus increasing product reliability.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A flat panel display, comprising:
   a base frame comprising a control unit;
   a display panel module, disposed in the base frame, the display panel module comprising a back bracket, a first heating element, and a second heating element, wherein the first heating element and the second heating element are disposed in the back bracket and electrically connected to the control unit; and
   a heat-conductive structure disposed between the back bracket and the base frame, wherein the position of the heat-conductive structure is corresponding to the position of the first heating element.

2. The flat panel display as claimed in claim 1, wherein the display panel module further comprises a liquid crystal display panel disposed in the back bracket and electrically connected with the first heating element.

3. The flat panel display as claimed in claim 2, wherein the first heating element is a timing control panel, and the second heating element is a light emitting device.

4. The flat panel display as claimed in claim 1, wherein the heat-conductive structure comprises a heat-conductive member and at least one heat-conductive interface, and the heat-conductive member is disposed between the base frame and the back bracket.

5. The flat panel display as claimed in claim 4, wherein the heat-conductive interface is disposed between the back bracket and the heat-conductive member.

6. The flat panel display as claimed in claim 4, wherein the heat-conductive interface is disposed between the base frame and the heat-conductive member.

7. The flat panel display as claimed in claim 4, wherein the number of the at least one heat-conductive interface is plural, and the plurality of the heat-conductive interfaces are respectively disposed between the base frame and the heat-conductive member and between the back bracket and the heat-conductive member.

8. The flat panel display as claimed in claim 4, wherein the heat-conductive interface is a thermal paste or a thermal pad.

9. The flat panel display as claimed in claim 4, wherein the heat-conductive member is of material comprising high thermal conductivity.

10. The flat panel display as claimed in claim 9, wherein the heat-conductive member is of graphite or metal.

11. The flat panel display as claimed in claim 4, wherein the heat-conductive member comprises:
a first portion, abutting the back bracket;
a second portion, abutting the base frame; and
a connecting portion, connecting the first portion and the second portion.

12. The flat panel display as claimed in claim 11, wherein the first portion, the second portion, and the connecting portion are integrally formed as a single piece.

13. A flat panel display, comprising:
a base frame, comprising a control unit;
a display panel module, disposed in the base frame, the display panel module comprising a back bracket, a first heating element, and a second heating element, wherein the first heating element and the second heating element are disposed in the back bracket and electrically connected to the control unit, and a first distance is formed between the back bracket and the base frame to define a first air passage, a second distance is formed between the back bracket and the base frame to define a second air passage, and the first distance is shorter than the second distance; and
a heat-conductive structure, disposed in the first air passage, wherein the position of the heat-conductive structure is corresponding to the position of the first heating element.

14. The flat panel display as claimed in claim 13, wherein the first heating element is a timing control panel, and the second heating element is a light emitting device.

15. The flat panel display as claimed in claim 13, wherein the heat-conductive structure comprises a heat-conductive member and at least one heat-conductive interface, and the heat-conductive member is disposed between the base frame and the back bracket.

16. The flat panel display as claimed in claim 15, wherein the heat-conductive interface is disposed between the back bracket and the heat-conductive member.

17. The flat panel display as claimed in claim 15, wherein the heat-conductive interface is disposed between the base frame and the heat-conductive member.

18. The flat panel display as claimed in claim 15, wherein the heat-conductive member is of material comprising high thermal conductivity.

19. The flat panel display as claimed in claim 15, wherein the heat-conductive interface is a thermal paste or a thermal pad.

20. The flat panel display as claimed in claim 15, wherein the heat-conductive member comprises:
a first portion, abutting the back bracket;
a second portion, abutting the base frame; and
a connecting portion, connecting the first portion and the second portion.

* * * * *